US009810715B2

(12) United States Patent
Campbell et al.

(10) Patent No.: US 9,810,715 B2
(45) Date of Patent: Nov. 7, 2017

(54) HIGH IMPEDANCE COMPLIANT PROBE TIP

(71) Applicant: Tektronix, Inc., Beaverton, OR (US)

(72) Inventors: Julie A. Campbell, Beaverton, OR (US); Ira G. Pollock, Hillsboro, OR (US); William A. Hagerup, Portland, OR (US); Christina D. Enns, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 104 days.

(21) Appl. No.: 14/587,703

(22) Filed: Dec. 31, 2014

(65) Prior Publication Data

US 2016/0187382 A1  Jun. 30, 2016

(51) Int. Cl.
*G01R 1/067* (2006.01)
*H01R 13/24* (2006.01)
(Continued)

(52) U.S. Cl.
CPC ..... *G01R 1/06772* (2013.01); *G01R 1/06722* (2013.01); *G01R 1/06766* (2013.01);
(Continued)

(58) Field of Classification Search
CPC ....... H01L 21/00; H01L 2221/00; G01R 1/00; H02J 1/00; G05G 1/00; G05G 2505/00;
(Continued)

(56) References Cited

U.S. PATENT DOCUMENTS

| 2,849,681 | A | | 8/1958 | Belart | |
|---|---|---|---|---|---|
| 3,136,973 | A | * | 6/1964 | Randolph | H01C 1/024 338/237 |

(Continued)

FOREIGN PATENT DOCUMENTS

| DE | 8417746 U1 | 1/1986 |
|---|---|---|
| DE | 3533227 A1 | 4/1986 |
| DE | 102009008156 A1 | 8/2010 |

OTHER PUBLICATIONS

Jis-c: "Carbon Film MELF Resistors", http://www.cinetech.com.tw/upload/2011/06/20110617152049.pdf (retrieved from the internet, Aug. 3, 2016), pp. 1-2, Jun. 1, 2011.

(Continued)

*Primary Examiner* — Jermele M Hollington
*Assistant Examiner* — Temilade Rhodes-Vivour
(74) *Attorney, Agent, or Firm* — Marger Johnson; Kevin D. Dothager

(57) ABSTRACT

A test probe tip can include a compliance member or force deflecting assembly and a tip component. The compliance member or force deflecting assembly can include a plunger component and a barrel component to receive the plunger component, wherein the plunger component is configured to slide axially inside the barrel component. The test probe tip can also include a spring mechanism within the barrel component to act on the plunger component, and a resistive/impedance element, e.g., a round rod resistor, coupled with the plunger component at one end and with the tip component at the opposite end.

17 Claims, 5 Drawing Sheets

(51) Int. Cl.
  *H03F 1/00* (2006.01)
  *H01L 21/00* (2006.01)
  *G05G 1/00* (2006.01)
  *G01R 1/073* (2006.01)
  *H01R 101/00* (2006.01)

(52) U.S. Cl.
  CPC ......... *H01R 13/2421* (2013.01); *G01R 1/073* (2013.01); *G05G 1/00* (2013.01); *H01L 21/00* (2013.01); *H01R 2101/00* (2013.01); *H01R 2201/20* (2013.01); *H03F 1/00* (2013.01)

(58) Field of Classification Search
  CPC .......... H01H 1/00; H01H 45/00; H01H 63/00; H03F 1/00
  See application file for complete search history.

(56) References Cited

U.S. PATENT DOCUMENTS

| | | | |
|---|---|---|---|
| 3,174,123 A * | 3/1965 | Frederico | H01P 1/24 333/22 R |
| 3,578,428 A * | 5/1971 | Lee | C03B 5/12 65/126 |
| 3,859,568 A * | 1/1975 | Sakshaug | H01T 4/20 315/36 |
| 4,884,034 A * | 11/1989 | Guzman | G01R 31/025 324/528 |
| 5,045,780 A * | 9/1991 | Swart | G01R 1/06722 324/72.5 |
| 5,136,237 A | 8/1992 | Smith et al. | |
| 6,222,378 B1 | 4/2001 | Campbell et al. | |
| D444,401 S | 7/2001 | Campbell | |
| D444,720 S | 7/2001 | Campbell | |
| D444,721 S | 7/2001 | Campbell | |
| 6,433,527 B1 * | 8/2002 | Izadinia | H02M 3/1584 323/300 |
| 6,462,529 B1 | 10/2002 | Campbell | |
| 6,518,780 B1 | 2/2003 | Campbell et al. | |
| 6,538,424 B1 | 3/2003 | Campbell | |
| 6,605,934 B1 | 8/2003 | Campbell et al. | |
| 6,650,131 B2 | 11/2003 | Campbell et al. | |
| 6,809,535 B2 | 10/2004 | Campbell | |
| 6,828,769 B2 | 12/2004 | Campbell et al. | |
| 6,863,576 B2 | 3/2005 | Campbell et al. | |
| 6,956,362 B1 | 10/2005 | Campbell et al. | |
| 7,009,377 B2 | 3/2006 | Campbell et al. | |
| 7,019,544 B1 | 3/2006 | Jacobs et al. | |
| 7,116,121 B1 * | 10/2006 | Holcombe | G01R 1/06772 324/754.07 |
| 7,140,105 B2 | 11/2006 | Campbell | |
| 7,173,439 B1 | 2/2007 | Campbell et al. | |
| 7,202,678 B2 | 4/2007 | Campbell et al. | |
| 7,221,179 B1 | 5/2007 | Campbell | |
| 7,242,202 B2 | 7/2007 | Groshong et al. | |
| 7,262,614 B1 | 8/2007 | Campbell | |
| 7,295,020 B2 | 11/2007 | Campbell et al. | |
| 7,317,312 B1 | 1/2008 | Tsai et al. | |
| 7,321,234 B2 | 1/2008 | Campbell et al. | |
| 7,432,698 B1 | 10/2008 | Campbell et al. | |
| 7,492,177 B1 | 2/2009 | Campbell | |
| 7,525,328 B2 | 4/2009 | Campbell et al. | |
| 7,671,613 B1 | 3/2010 | Campbell | |
| 8,098,078 B1 | 1/2012 | Campbell | |
| 8,134,377 B1 | 3/2012 | Campbell et al. | |
| 8,421,488 B1 | 4/2013 | Campbell et al. | |
| 8,786,299 B1 | 7/2014 | Campbell | |
| 2003/0222665 A1 | 12/2003 | Dascher | |
| 2005/0079772 A1 | 4/2005 | Delessert | |
| 2008/0158760 A1 * | 7/2008 | Moyer | H05B 41/2851 361/93.1 |

OTHER PUBLICATIONS

Extended European Search Report for European Patent Application No. 15203192.8, mailed Jul. 19, 2016, 15 pages.

* cited by examiner

HIGH IMPEDANCE COMPLIANT PROBE TIP

TECHNICAL FIELD

This disclosure relates generally to test probes and, more particularly, to probe tips for test probes.

BACKGROUND

Today's engineers are attempting to test devices that carry high-speed serial busses. Many of these devices can be identified as, but are not limited to, double data rate second generation (DDR2) synchronous dynamic random-access memory (SDRAM), double data rate fourth generation (DDR4) SDRAM, and peripheral component interconnect express (PCIe). The magnitude of voltage swings and pulse frequencies are very high and the complexity of the signaling requires precise electrical probing. These and other busses are becoming highly prevalent in various types of consumer hardware devices. There are many test points of interest in each of these products.

The test points in these products vary greatly in both geometry and accessibility, usually requiring one or two points of contact. Typically, points of contact include micro traces, vias, component pads, and connector contacts that provide electrical contact with and, thus, access to high-speed signals. However, the test points are not always in the same plane and, if two probe contacts are required at once (e.g., as in the case of a differential probe), tip compliance is highly desirable to assist with positioning the probe for proper contact. Points of contact may reside on principal component analysis (PCA) hardware in virtually every angle of orientation, including from vertical to horizontal. In these types of scenarios, the test points are better accessed by probe tips with compliance.

While there are semi-permanent forms of probe contact for these access points, including the soldering or conductive epoxying of wires to these points, such solutions present a number of disadvantages, including potential damage to the device under test (DUT) during connection, long set-up times, and a requirement for exceptional dexterity skills in order to solder wires to these test points. Also, semi-permanent contacts do not provide for quick debugging. Solder-in probe tips tend to wear out after only a few connections and, thus, create a need for replacements, which can be significantly expensive. Finally, there tends to be a high variability in the signal fidelity, particularly in upper signal frequencies, due to the quality and geometry of solder and/or epoxy connections.

Accordingly, there remains a need for improved probe tips for use in connection with test probes.

SUMMARY

Embodiments of the disclosed technology generally pertain to probe tips suitable for use with test probes. A test probe tip may include a compliance member or force deflecting assembly that includes a barrel component that receives a plunger base coupled with a resistive/impedance element that is also coupled with a tip component. A spring mechanism may be trapped or otherwise positioned within the barrel component and the plunger base may be configured to slide axially inside the barrel component and be acted upon by the spring mechanism therein to advantageously create a compression resistance, e.g., with a test point on a DUT.

DETAILED DESCRIPTION

Embodiments of the disclosed technology generally include probe tips suitable for use with a test probe and configured to provide a precise, height-compliant, quick, and light-pressure contact with a test point, e.g., on a device under test (DUT). Such a probe tip may be configured as a spring probe that includes a resistive or impedance element positioned nearly at the point of contact with the DUT. The resistive or impedance element may greatly improve the through response of the spring probe and also decrease the DUT loading significantly, thus enabling high-speed signal acquisition.

Test probes and probe tips in accordance with the disclosed technology may advantageously create a better physical and electrical control of the contact area and also lend themselves well to fast debugging environments that typically cannot accommodate long contact setup times. Test probes and probe tips in accordance with the disclosed technology may advantageously provide superior visibility for connection placement and intuitive operation various classes of products, specifically hand-held or rapid placement probing.

Figure 1:
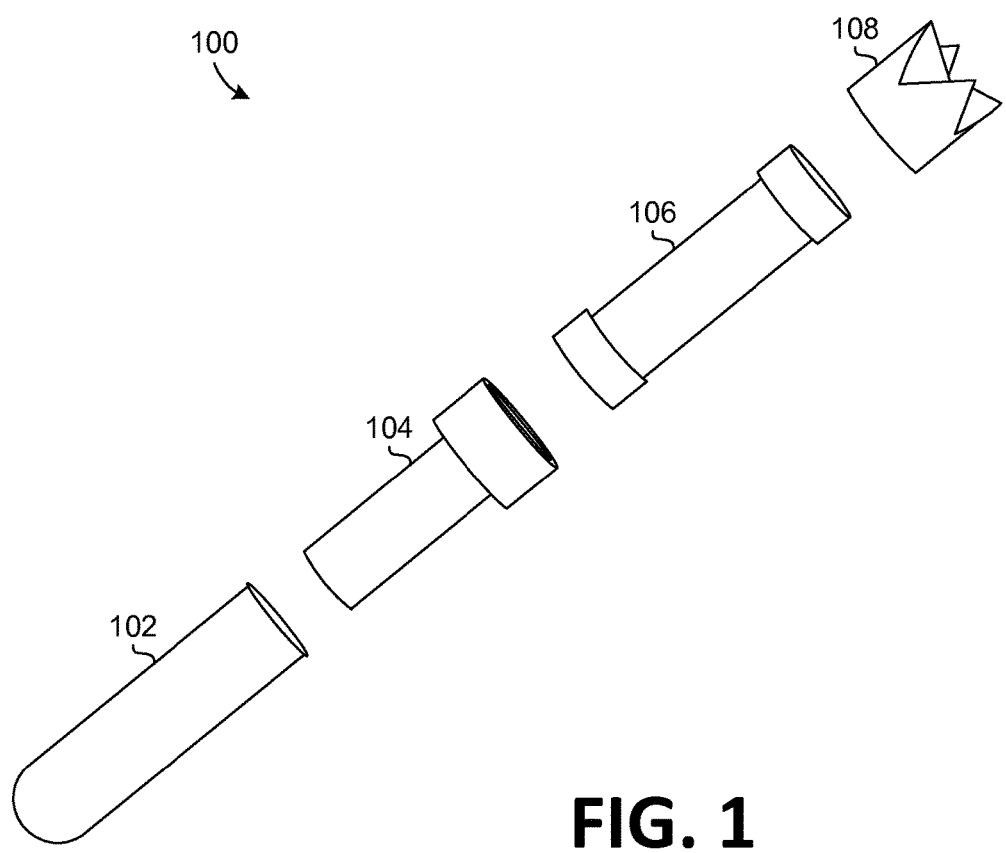
FIG. 1 illustrates an exploded view of an example of a probe tip in accordance with certain embodiments of the disclosed technology.

FIG. 1 illustrates an exploded view of an example of a test probe tip 100 in accordance with certain embodiments of the disclosed technology. In the example, the test probe tip 100 includes a compliance member or force deflecting assembly and a tip component 108 coupled therewith.

In the example, the compliance member or force deflecting assembly includes a barrel component 102 configured to be integrated with a test probe. The probe tip 100 also includes a resistive/impedance element 106, e.g., a round rod resistor, and a plunger base component 104 configured to be coupled, e.g., by way of an electro-mechanical bond, with an end surface of the resistive/impedance element 106.

The resistive/impedance element 106 may be have a tube-like form with resistance on the outside full circumference thereof. For example, the resistive/impedance element 106 may include a resistive coating that covers a tube and the metal connection may be a short overlapping tube on the ends. The tube-like structure of the resistor may enable high bandwidth, low bandwidth loading. Round surfaces of the resistive/impedance element 106 may advantageously maximize the cross-sectional strength of the resistive/impedance element 106.

In the example, the tip component 108 is configured to be coupled, e.g., by way of an electro-mechanical bond, with an end surface of the resistive/impedance element 106 opposite the end surface that is coupled with the plunger base component 104. The tip component 108 may have one or more sharp points, e.g., to establish or otherwise facilitate fine-grain electrical connectivity with one or more contact points on a DUT.

A spring mechanism may be trapped or otherwise positioned within the barrel component 102, and the plunger base 104 may be configured to slide axially inside the barrel component 102 and, consequently, be acted upon by the spring mechanism positioned inside the barrel component 102 to advantageously create a compression resistance.

Figure 2:
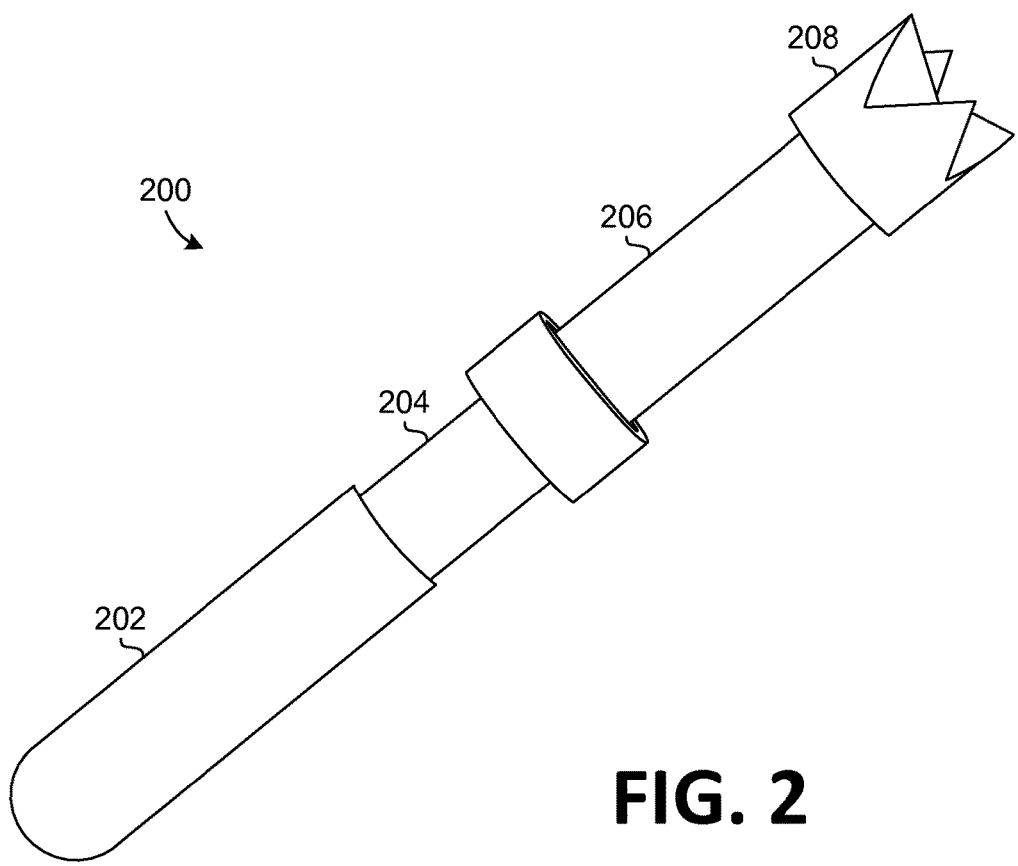
FIG. 2 illustrates an assembled view of the probe tip illustrated by FIG. 1 in accordance with certain embodiments of the disclosed technology.

FIG. 2 illustrates an assembled view of an example of a test probe tip 200 having a compliance member or force deflecting assembly and a tip component coupled therewith in accordance with certain embodiments of the disclosed technology. In the example, a barrel component 202 receives a plunger base 204 that is coupled, e.g., by way of an electro-mechanical bond, with an end of a resistive/impedance element 206. The resistive/impedance element 206 may have a tube-like form with resistance on the outside full circumference thereof. In the example, a tip component 208 is coupled, e.g., by way of an electro-mechanical bond, with an end of the resistive/impedance element 206 opposite the end thereof that is coupled with the plunger base 204.

As with the test probe tip 100 illustrated by FIG. 1, a spring mechanism may be trapped or otherwise positioned within the barrel component 202, and the plunger base 204 may be configured to slide axially inside the barrel component 202 and be acted upon by the spring mechanism therein to advantageously create a compression resistance.

Figure 3:
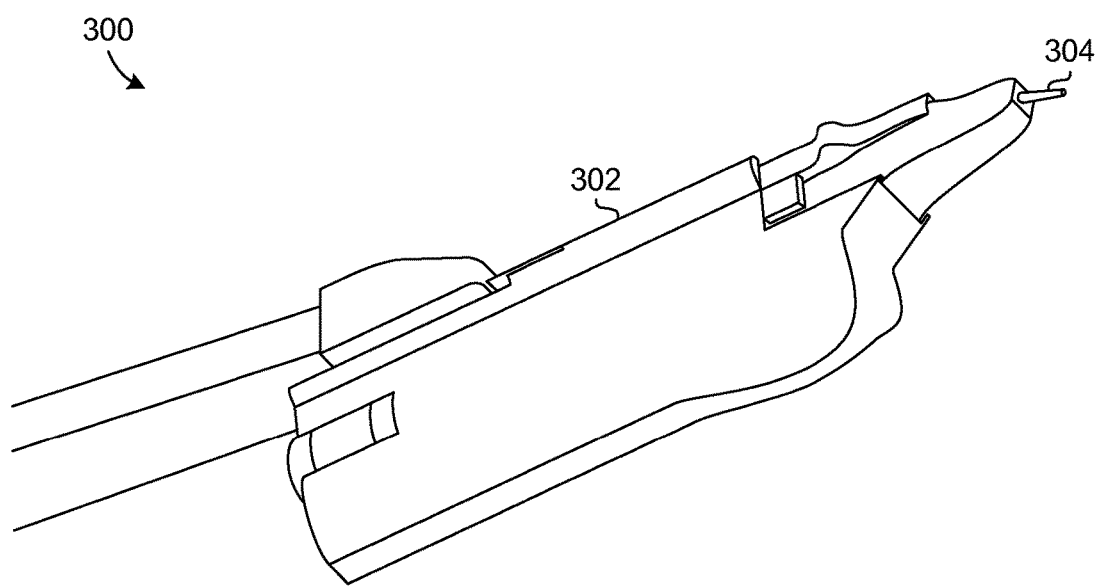
FIG. 3 illustrates an example of a single-tip test probe in accordance with certain embodiments of the disclosed technology.

FIG. 3 illustrates an example of a single-tip test probe 300 in accordance with certain embodiments of the disclosed technology. In the example, the test probe 300 includes a test probe body 302 and a test probe tip 304, such as the test probe tips 100 and 200 illustrated by FIGS. 1 and 2, respectively. A user may use the test probe 300 to create a compression resistance between the test probe tip 304 and a test point, such as a high-speed signal access point or other suitable point on a DUT, for example.

Figure 4:
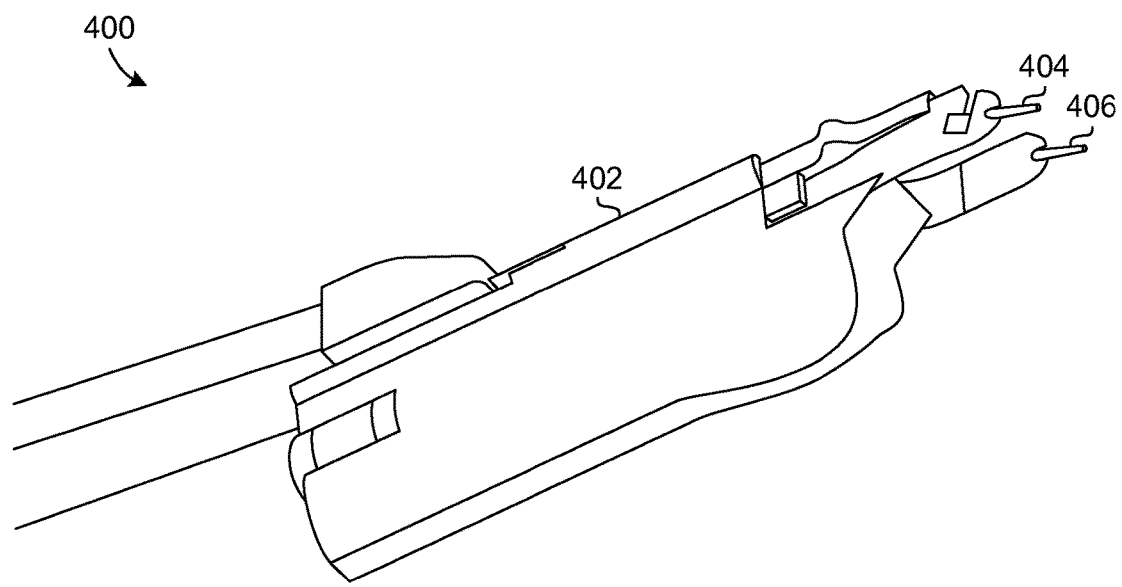
FIG. 4 illustrates an example of a differential probe in accordance with certain embodiments of the disclosed technology.

FIG. 4 illustrates an example of a differential probe 400 in accordance with certain embodiments of the disclosed technology. In the example, the differential probe 400 includes a probe body 402 and two test probe tips 404 and 406, such as the test probe tips 100 and 200 illustrated by FIGS. 1 and 2, respectively. A user may use the differential probe 400 to create a compression resistance between either or both of the test probe tips 404 and 406 and one or two test points, such as a high-speed signal access point or other suitable point on a DUT, for example.

Figure 5:
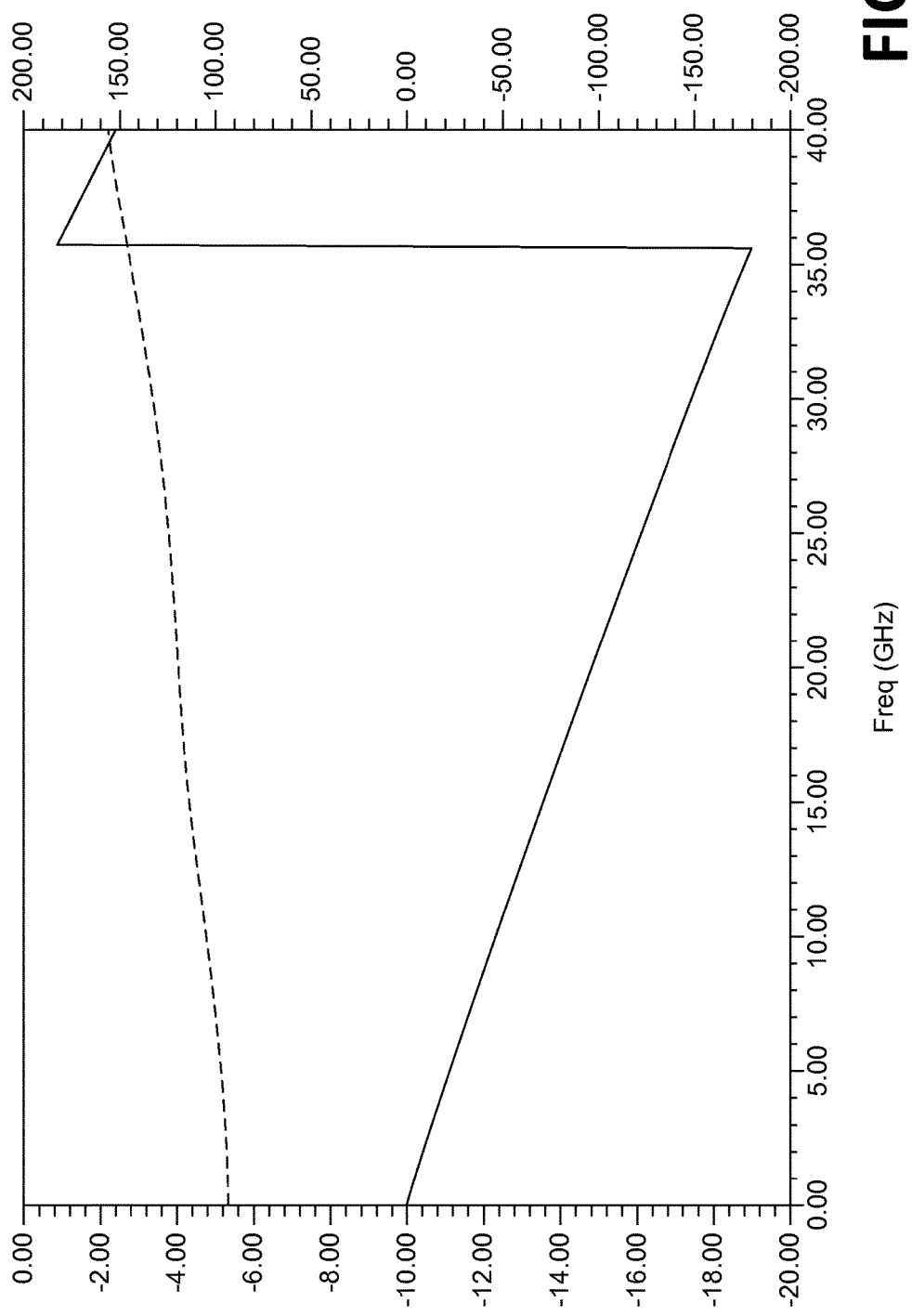
FIG. 5 is a graphical representation of an example of a frequency response plot for a test probe tip in accordance with certain embodiments of the disclosed technology.

FIG. 5 is a graphical representation of an example of a frequency response plot 500 for a test probe tip in accordance with certain embodiments of the disclosed technology. The configuration of the resistor fabrication (e.g., rod tube nature) and close proximity to the contact point of the DUT contact generates a highly flat response to signals on the DUT, yielding high signal reproduction fidelity while keeping DUT loading to a minimum. This is important for measuring signal busses that are sensitive to loading. If the tip/probe input structure loads (e.g., reduces or alters the signal eye) the signaling between transmitter-receiver is interrupted, the communication bus under test fails to work properly, which ruins the test. Probe tips in accordance with the disclosed technology advantageously limits this issue greatly.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A test probe tip, comprising:
   a force deflecting assembly;
   a resistive/impedance element configured to be coupled with the force deflecting assembly, wherein the resistive/impedance element is a round rod resistor that includes a resistive coating covering a tube; and
   a tip component configured to be coupled with the resistive/impedance element, wherein the resistive/impedance element is configured to be coupled with the force deflecting assembly and the tip component via electro-mechanical bonds such that the resistive/impedance element forms a structural component of the test probe tip without an insulating covering applied thereto.

2. The test probe tip of claim 1, wherein the force deflecting assembly includes:
   a plunger component configured to be coupled with the resistive/impedance element;
   a barrel component configured to receive the plunger component, wherein the plunger component is configured to slide axially inside the barrel component; and
   a spring mechanism positioned within the barrel component and configured to act on the plunger component responsive to the plunger component sliding in an inward direction inside the barrel component.

3. The test probe tip of claim 2, wherein the resistive/impedance element is coupled with the plunger component by way of an electro-mechanical bond.

4. The test probe tip of claim 1, wherein the tip component is coupled with the resistive/impedance element by way of an electro-mechanical bond.

5. The test probe tip of claim 1, wherein the tip component includes at least one probe point configured to establish an electrical connection with a test point on a device under test (DUT).

6. The test probe tip of claim 2, wherein the spring mechanism is configured to create a compression resistance between the probe tip and a test point on a device under test (DUT).

7. The test probe tip of claim 1, wherein the round rod resistor further includes a metal connection formed by an overlapping tube on each end of the round rod resistor.

8. A test probe, comprising:
   a test probe body; and
   at least one test probe tip integrated with the test probe body, each test probe tip including:
      a compliance member;

a round rod resistor configured to be coupled with the compliance member, wherein the round rod resistor includes a resistive coating covering a tube; and a tip component configured to be coupled with the round rod resistor, wherein the round rod resistor is configured to be coupled with the force deflecting assembly and the tip component via electro-mechanical bonds such that the resistive/impedance element forms a structural component of the test probe tip without an insulating covering applied thereto.

9. The test probe of claim 8, wherein the compliance member includes:

a plunger component;

a barrel component configured to receive the plunger component, wherein the plunger component is configured to slide axially inside the barrel component;

a spring mechanism positioned within the barrel component and configured to act on the plunger component responsive to the plunger component sliding in an inward direction inside the barrel component.

10. The test probe of claim 9, wherein the round rod resistor is coupled with the plunger component by way of an electro-mechanical bond.

11. The test probe of claim 8, wherein the tip component is coupled with the round rod resistor by way of an electro-mechanical bond.

12. The test probe of claim 8, wherein the tip component includes at least one probe point configured to establish an electrical connection between the test probe and a test point on a device under test (DUT).

13. The test probe of claim 9, wherein the spring mechanism is configured to create a compression resistance between the test probe and a test point on a device under test (DUT).

14. The test probe of claim 8, comprising two test probe tips.

15. The test probe of claim 14, wherein the compliance member of each of the two test probe tips includes:

a plunger component;

a barrel component configured to receive the plunger component, wherein the plunger component is configured to slide axially inside the barrel component;

a spring mechanism positioned within the barrel component and configured to act on the plunger component responsive to the plunger component sliding in an inward direction inside the barrel component.

16. The test probe of claim 8, wherein the round rod resistor includes a metal connection formed by an overlapping tube on each end.

17. The test probe of claim 9, wherein the test probe is a differential probe having two test probe tips.

* * * * *